(12) United States Patent
Bae et al.

(10) Patent No.: US 11,024,684 B2
(45) Date of Patent: Jun. 1, 2021

(54) DISPLAY DEVICE

(71) Applicant: LG Display Co., Ltd., Seoul (KR)

(72) Inventors: Kyoung-Ji Bae, Uiwang-si (KR);
Heum-Il Baek, Goyang-si (KR);
Sam-Jong Lee, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 77 days.

(21) Appl. No.: 15/655,440

(22) Filed: Jul. 20, 2017

(65) Prior Publication Data
US 2018/0033842 A1    Feb. 1, 2018

(30) Foreign Application Priority Data

Jul. 29, 2016 (KR) .......................... 10-2016-0097020

(51) Int. Cl.
*H01L 27/32* (2006.01)
*H01L 27/15* (2006.01)
*H01L 51/00* (2006.01)
*H01L 51/52* (2006.01)

(52) U.S. Cl.
CPC ........ *H01L 27/3246* (2013.01); *H01L 27/156* (2013.01); *H01L 27/3216* (2013.01); *H01L 51/0003* (2013.01); *H01L 51/0012* (2013.01); *H01L 51/5206* (2013.01); *H01L 51/0005* (2013.01)

(58) Field of Classification Search
CPC ............. H01L 27/3246; H01L 27/3216; H01L 27/3283
See application file for complete search history.

(56) References Cited

U.S. PATENT DOCUMENTS

| 8,593,057 | B2* | 11/2013 | Park | H01L 51/5036 |
| | | | | 313/504 |
| 2005/0156515 | A1* | 7/2005 | Fukase | H01L 27/326 |
| | | | | 313/504 |
| 2009/0251051 | A1* | 10/2009 | Hwang | H01L 27/3213 |
| | | | | 313/504 |
| 2013/0056784 | A1* | 3/2013 | Lee | H01L 27/3279 |
| | | | | 257/99 |

(Continued)

FOREIGN PATENT DOCUMENTS

| CN | 1638571 A | 7/2005 |
| CN | 103840090 A | 6/2014 |

(Continued)

*Primary Examiner* — Khaja Ahmad
*Assistant Examiner* — Khatib A Rahman
(74) *Attorney, Agent, or Firm* — Birch, Stewart, Kolasch & Birch, LLP

(57) ABSTRACT

A display device can include a substrate including first and second pixel regions; a first electrode in each of the first and second pixel regions; and a bank disposed at a boundary of each of the first and second pixel regions on the first electrode defining a first opening exposing a portion of the first electrode and a second opening within the bank defining a formation area of an emitting layer, the second opening is larger than the first opening, in which an area of the first opening in the first pixel region is smaller than an area of the first opening in the second pixel region, and an area of the second opening in the first pixel region is substantially same as an area of the second opening in the second pixel region.

12 Claims, 7 Drawing Sheets

(56) References Cited

U.S. PATENT DOCUMENTS

| | | | |
|---|---|---|---|
| 2016/0079323 A1* | 3/2016 | Choi | H01L 27/3246 257/40 |
| 2016/0087016 A1* | 3/2016 | Lee | H01L 27/3246 257/40 |
| 2016/0240592 A1* | 8/2016 | Li | H01L 27/3216 |
| 2017/0278906 A1* | 9/2017 | Song | H01L 27/326 |

FOREIGN PATENT DOCUMENTS

| | | |
|---|---|---|
| CN | 103904105 A | 7/2014 |
| CN | 104064582 A | 9/2014 |
| TW | 201246653 A1 | 11/2012 |

\* cited by examiner

DISPLAY DEVICE

CROSS-REFERENCE TO RELATED APPLICATIONS

The present application claims the benefit of Korean Patent Application No. 10-2016-0097020 filed in the Republic of Korea on Jul. 29, 2016, which is hereby incorporated by reference into the present application.

BACKGROUND

Field of Technology

The present disclosure relates to a display device, and more particularly, to a display device having excellent display quality.

Discussion of the Related Art

As information technology and mobile communication technology have been developed, a display device being capable of displaying a visual image has also been developed. Flat panel display devices, such as a liquid crystal display (LCD) device and an electroluminescent display device, are developed and used instead of a cathode ray tube because of advantages in weight, power consumption, and so on.

The electroluminescent display device has properties of high brightness and low driving voltage. In addition, since the electroluminescent display device is a self-emission type, the electroluminescent display device has excellent characteristics in contrast ratio, a thin profile and response time. The electroluminescent display device may be referred to as a light emitting display device.

FIG. 1 is a schematic cross-sectional view of the related art electroluminescent display device.

As shown in FIG. 1, an electroluminescent display device includes a thin film transistor (TFT) Tr on a substrate 10 and an emitting diode D electrically connected to the TFT Tr.

For example, the TFT Tr can include a gate electrode, a semiconductor layer, a source electrode and a drain electrode. The emitting diode D can include a first electrode 30, a second electrode 34 facing the first electrode 30 and an emitting layer 32 therebetween.

The first electrode 30 may include a first conductive material having a relatively high work function to serve as an anode, and the second electrode 34 may include a second conductive material having a relatively low work function to serve as a cathode. The first electrode 30 is connected to the drain electrode of the TFT Tr.

The emitting layer 32 may have a single-layered structure of an emitting material layer (EML). Alternatively, to increase an emitting efficiency, the emitting layer 32 may further include a hole injection layer (HIL) and a hole transporting layer (HTL) between the first electrode 30 and the EML and an electron transporting layer (ETL) and an electron injection layer (EIL) between the EML and the second electrode (cathode) 34.

When voltages are applied to the first and second electrodes 30 and 34, holes and electrons from the first and second electrodes 30 and 34 are injected into the emitting layer 32. The holes and electrons are combined to form excitons, and the excitons transition from an excited state into a ground state such that the light is emitted from the emitting diode D.

In addition, the electroluminescent display device further includes a bank 40 covering edges of the first electrode 30. Namely, the bank 40 surrounds a boundary of the pixel region such that the pixel region is defined.

Further, the emitting layer 32 may include a red emitting material, a green emitting material and a blue emitting material in each pixel region to display a color image. In this instance, since the red, green and blue emitting materials have different life expectancies and emitting efficiencies, there are problems associated with the lifespan and display quality of the electroluminescent display device when the red, green and blue pixel regions all have the same area.

Particularly, when the emitting layer 32 is formed by a solution process, a thickness uniformity of the emitting layer is decreased such that an emitting area is reduced and the lifespan is reduced.

SUMMARY

Accordingly, the present invention is directed to a display device that substantially obviates one or more of the problems due to limitations and disadvantages of the related art.

An object of the present invention is to provide a display device that has a high display quality and long lifetime.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a display device includes a substrate including first and second pixel regions; a first electrode in each of the first and second pixel regions; and a bank at a boundary of the first and second pixel regions on the first electrode to define a first opening exposing a portion of the first electrode and a second opening defining a formation area of emitting layer, the second opening greater than the first opening, in which an area of the first opening in the first pixel region is smaller than an area of the first opening in the second pixel region, and an area of the second opening in the first pixel region is substantially same as an area of the second opening in the second pixel region.

In another aspect, a display device includes a substrate including first and second pixel regions; a first electrode in each of the first and second pixel regions; and a bank at a boundary of the first and second pixel regions and including a first bank pattern on the first electrode and a second bank pattern on the first bank pattern, in which the first bank pattern in the first pixel region protrudes from the second bank pattern by a first length along a first direction, and the first bank pattern in the second pixel region protrudes from the second bank pattern by a second length, which is smaller than the first length, along the first direction.

In another aspect, a display device includes a substrate including first and second pixel regions; a first electrode in each of the first and second pixel regions; a bank at a boundary of the first and second pixel regions on the first electrode; an emitting layer on the first electrode; and a second electrode covering the emitting layer and the bank, in which a contact area between the emitting layer and the bank in the first pixel region is larger than that in the second pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to the preferred embodiments, examples of which are illustrated in the accompanying drawings.

Figure 1:
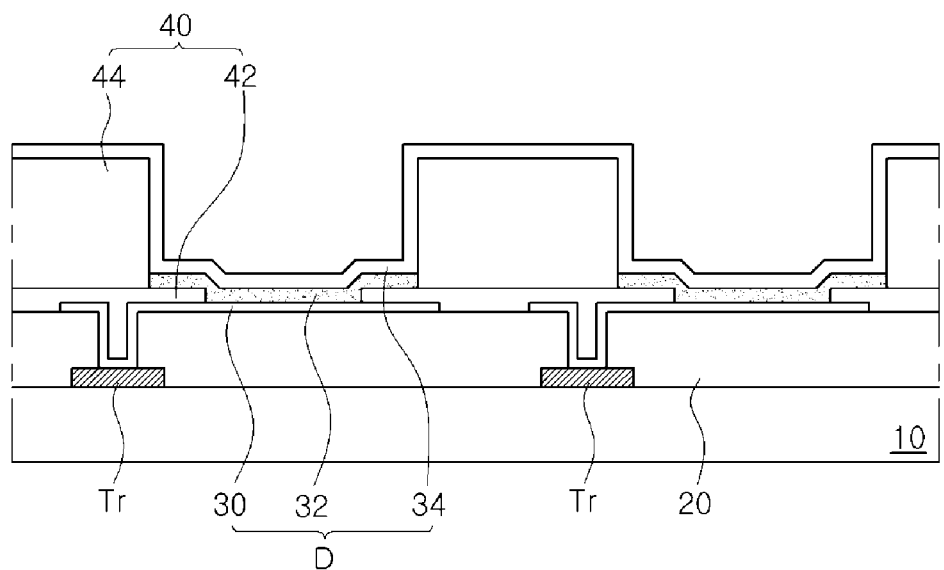
FIG. 1 is a schematic cross-sectional view of the related art electroluminescent display device.
Figure 2:
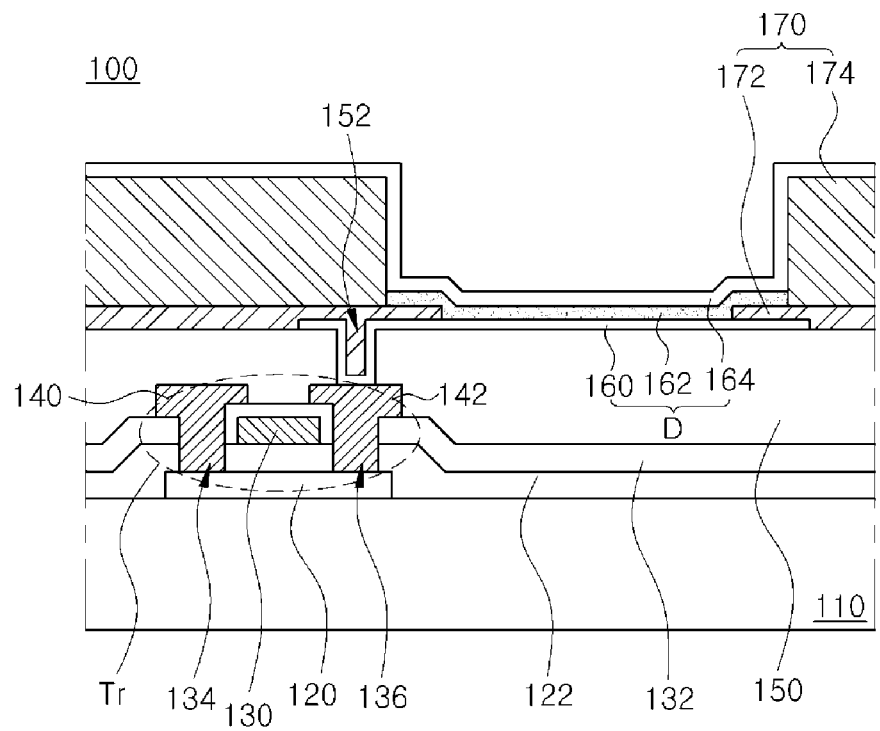
FIG. 2 is a schematic cross-sectional view of a display device according to an embodiment of the present invention.

FIG. 2 is a schematic cross-sectional view of an electroluminescent display device according to an embodiment of the present invention.

As shown in FIG. 2, a display device 100 includes a substrate 110 including a pixel region, a TFT Tr on or over the substrate 110 and in each pixel region, an emitting diode D connected to the TFT Tr and a bank 170 surrounding the pixel region.

The substrate 110 can be a glass substrate or a flexible substrate of a metal or a plastic. For example, the substrate 110 can be a polyimide substrate.

A buffer layer of an inorganic material, e.g., silicon oxide or silicon nitride, can be formed on the substrate 110. Namely, the TFT Tr can be formed on the substrate 110 or the buffer layer.

The TFT Tr includes a semiconductor layer 120, a gate electrode 130, a source electrode 140 and a drain electrode 142 and serves as a driving element.

The semiconductor layer 120 is formed on the substrate 110. The semiconductor layer 120 can be formed of an oxide semiconductor material or a poly-silicon.

When the semiconductor layer 120 includes the oxide semiconductor material, a light-shielding pattern can be formed under the semiconductor layer 120. The light to the semiconductor layer 120 is shielded or blocked by the light-shielding pattern such that thermal degradation of the semiconductor layer 120 can be prevented. Further, when the semiconductor layer 120 includes polycrystalline silicon, impurities can be doped into both sides of the semiconductor layer 120.

A gate insulating layer 122 is formed on the semiconductor layer 120. The gate insulating layer 122 can be formed of an inorganic insulating material such as silicon oxide or silicon nitride.

A gate electrode 130, which is formed of a conductive material, e.g., metal, is formed on the gate insulating layer 122 to correspond to a center of the semiconductor layer 120.

In FIG. 2, the gate insulating layer 122 is formed on the entire surface of the substrate 110. Alternatively, the gate insulating layer 122 can be patterned to have the same shape as the gate electrode 130.

An interlayer insulating layer 132, which is formed of an insulating material, is formed on an entire surface of the substrate 110 including the gate electrode 130. The interlayer insulating layer 132 can be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 120. The first and second contact holes 134 and 136 are positioned at both sides of the gate electrode 130 to be spaced apart from the gate electrode 130.

In FIG. 2, the first and second contact holes 134 and 136 extend into the gate insulating layer 122. Alternatively, when the gate insulating layer 122 is patterned to have the same shape as the gate electrode 130, there may be no first and second contact holes 134 and 136 in the gate insulating layer 122.

A source electrode 140 and a drain electrode 142, which are formed of a conductive material, e.g., metal, are formed on the interlayer insulating layer 132. The source electrode 140 and the drain electrode 142 are spaced apart from each other with respect to the gate electrode 130 and respectively contact both sides of the semiconductor layer 120 through the first and second contact holes 134 and 136.

The gate electrode 130, the source electrode 140 and the drain electrode 142 are positioned over the semiconductor layer 120. Namely, the TFT Tr has a coplanar structure.

Alternatively, in the TFT Tr, the gate electrode can be positioned under the semiconductor layer, and the source and drain electrodes can be positioned over the semiconductor layer such that the TFT Tr can have an inverted staggered structure. In this instance, the semiconductor layer can include amorphous silicon.

In addition, a gate line and a data line are disposed on or over the substrate 110 and cross each other to define a pixel region. In addition, a switching element, which is electrically connected to the gate line and the data line, can be disposed on the substrate or flexible substrate 110. The switching element is electrically connected to the TFT Tr as the driving element.

In addition, a power line, which is parallel to and spaced apart from the gate line or the data line, can be formed on or over the substrate 110. Moreover, a storage capacitor for maintaining a voltage of the gate electrode 130 of the TFT Tr during one frame, can be further formed on the substrate 110.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed on the passivation layer 150 in each pixel region. The first electrode 160 can be an anode and can be formed of a conductive material having a relatively high work function. For example, the first electrode 160 can be formed of a transparent conductive material such as indium-tin-oxide (ITO) or indium-zinc-oxide (IZO).

When the display device 100 of the present invention is a top-emission type, a reflection electrode or a reflection layer can be formed under the first electrode 160. For example, the reflection electrode or the reflection layer can be formed of aluminum-palladium-copper (APC) alloy.

A bank 170, which covers edges of the first electrode 160, is formed on the passivation layer 150. The bank 170 exposes a center of the first electrode 160 in the pixel region.

The bank 170 has a double-layered structure including a first bank pattern 172 and a second bank pattern 174. The first bank pattern 172 can be formed of a hydrophilic material, and the second bank pattern 174 can be formed of a hydrophobic material. Namely, the first bank pattern 172 has a hydrophilic property, and the second bank pattern 174 has a hydrophobic property.

The first bank pattern 172 covers the edges of the first electrode 160. The second bank pattern 174 is disposed on the first bank pattern 172 and has a smaller width than the first bank pattern 172. As a result, the second bank pattern 174 exposes a portion, e.g., an edge, of the first bank pattern 172 such that the edge of the first bank pattern 172 protrudes out from under the second bank pattern 174.

An emitting layer 162 is formed on the first electrode 160. The emitting layer 162 can include an organic emitting material or an inorganic emitting material. For example, the emitting layer 162 can include an organic emitting material, e.g., a phosphorescent emitting material, a fluorescent emitting material or a delayed-fluorescent emitting material, or an inorganic emitting material, e.g., a quantum dot or a quantum rod. Namely, the display device 100 of the present invention can be an organic emitting display device or an inorganic emitting display device.

The emitting layer 162 can have a single-layered structure of an emitting material layer formed of an emitting material. Alternatively, to improve emitting efficiency, the emitting layer 162 can have a multi-layered structure including a hole injection layer, a hole transporting layer, the emitting material layer, an electron transporting layer and an electron injection layer sequentially stacked on the first electrode 160.

When the emitting layer 162 is formed by a solution process, a thickness uniformity of the emitting layer 162 can be improved by the dual bank 170.

A second electrode 164 is formed over the substrate 110 including the emitting layer 162. The second electrode 164 is positioned at an entire surface of the display area. The second electrode 164 can be a cathode and can be formed of a conductive material having a relatively low work function. For example, the second electrode 164 can be formed of aluminum (Al), magnesium (Mg) or Al—Mg alloy.

The first electrode 160, the emitting layer 162 and the second electrode 164 constitute the emitting diode D.

In addition, an encapsulation film can be formed on the emitting diode D to prevent penetration of moisture into the emitting diode D.

Figure 3:
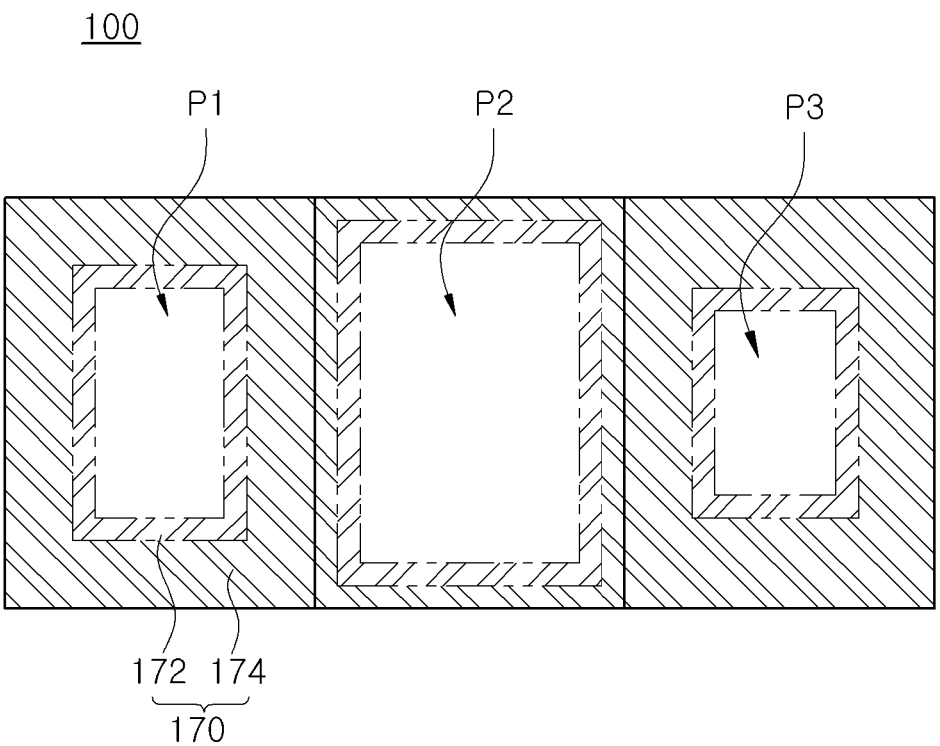
FIG. 3 is a schematic plane view of a unit pixel in a display device according to an embodiment of the present invention.
Figure 4A:
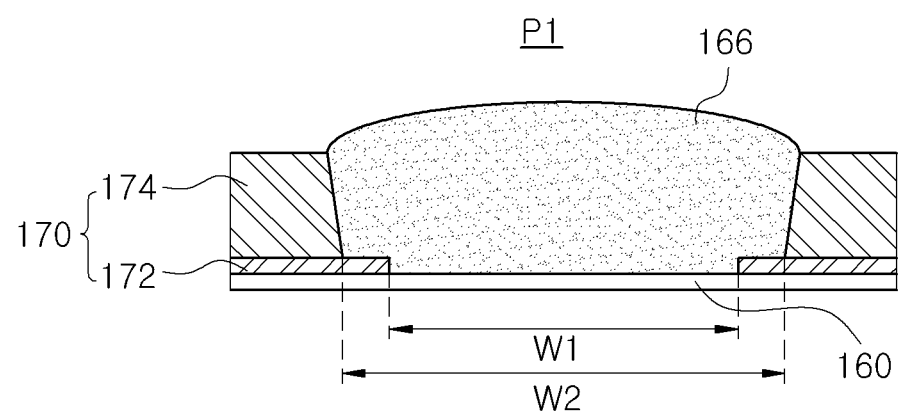
FIGS. 4A to 4C are schematic cross-sectional views of a pixel region in the display device according to an embodiment of the present invention.
Figure 4B:
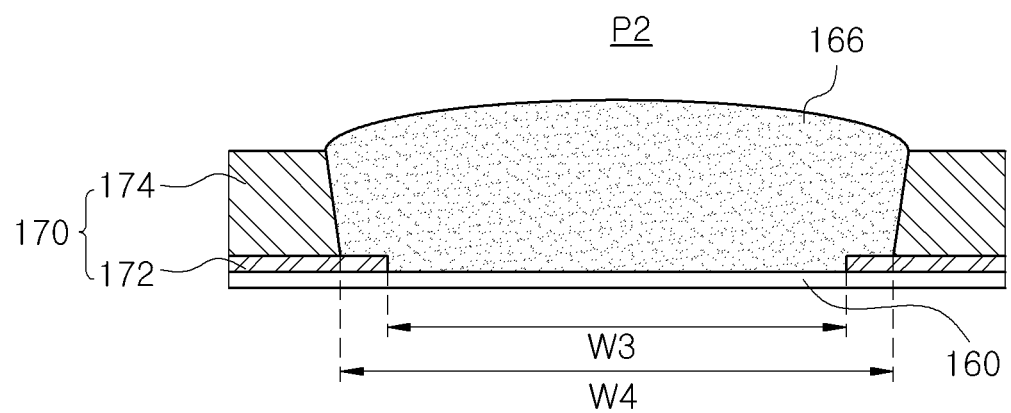
Figure 4C:
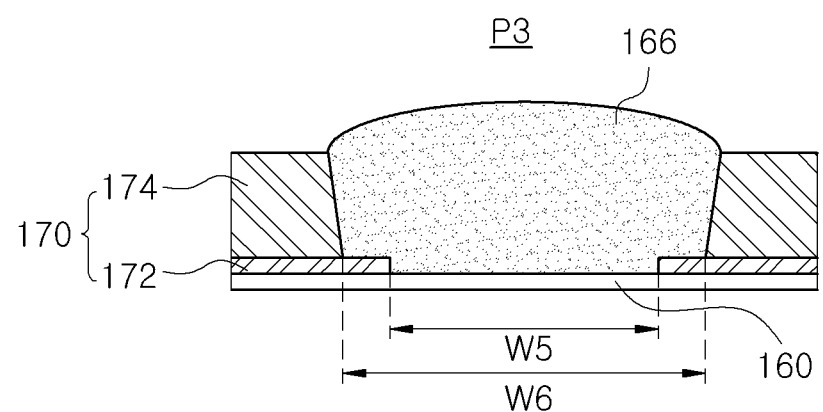

FIG. 3 is a schematic plane view of a unit pixel in a display device according to a first embodiment of the present invention, and FIGS. 4A to 4C are schematic cross-sectional views of a pixel region in the display device according to the first embodiment of the present invention.

Referring to FIGS. 3 and 4A to 4C, first to third pixel regions P1, P2 and P3, which are adjacently arranged, form a unit pixel and have different emitting areas. Namely, the first to third pixel regions P1 to P3 have different sized emitting areas, which are each defined as a region surrounded by the first bank pattern 172. In other words, a plane area of an opening, which is formed in the first bank pattern 172 and exposes the first electrode 160, is different in each of the first to third pixel regions P1 to P3.

Alternatively, two of the first to third pixel regions P1 to P3 can have same sized emitting area. For example, the first and third pixel regions P1 and P3 can have same emitting area size, while the second pixel region P2 can have the emitting area that is larger than the emitting areas in each of the first and third pixel regions P1 and P3.

In the first pixel region P1, two sides of the first bank pattern 172 are spaced apart from each other by a first distance such that the first bank pattern 172 includes a first opening having a first width W1, and two sides of the second bank pattern 174 are spaced apart from each other by a second distance, which is greater than the first distance, such that the second bank pattern 174 includes a second opening having a second width W2 being greater than the first width W1.

In the second pixel region P2, two sides of the first bank pattern 172 are spaced apart from each other by a third distance such that the first bank pattern 172 includes a first opening having a third width W3, and two sides of the second bank pattern 174 are spaced apart from each other by a fourth distance, which is greater than the third distance, such that the second bank pattern 174 includes a second opening having a fourth width W4 being greater than the third width W3.

In the third pixel region P3, two sides of the first bank pattern 172 are spaced apart from each other by a fifth distance such that the first bank pattern 172 includes a first opening having a fifth width W5, and two sides of the second bank pattern 174 are spaced apart from each other by a sixth distance, which is greater than the fifth distance, such that the second bank pattern 174 includes a second opening having a sixth width W6 being greater than the fifth width W5. The first opening in each of the first to third pixel regions P1 to P3 exposes a portion of the first electrode and the second opening in each of the first to third pixel regions P1 to P3 defines a formation area of emitting layer.

The first width W1 is smaller than the third width W3 and greater than the fifth width W5, and the second width W2 is smaller than the fourth width W4 and greater than the sixth width W6 (e.g., W5<W1<W3, W6<W2<W4). Accordingly, an emitting area (e.g., an area of the first opening, which is the lower opening directly over the first electrode) of the first pixel region P1 is smaller than the first opening in the second pixel region P2 and larger than the first opening in the third pixel region P3, and an opening area (e.g., an area of the second opening) of the first pixel region P1 is also smaller than the second pixel region P2 and larger than the third pixel region P3.

For example, the third pixel region P3 can be one of a red pixel region and a green pixel region having a longest lifetime, the second pixel region P2 can be a blue pixel region having a shortest lifetime, and the first pixel region P1 can be the other of the red pixel region and the green pixel region.

Accordingly, the blue pixel region provides a desired brightness with a low driving voltage, and problems associated with the lifespan and the display quality resulting from thermal degradation in the blue pixel region are prevented.

By increasing or decreasing areas of the first and second bank patterns of the display device having same emitting area in the pixel regions, the bank 170 in FIGS. 4A to 4C is provided.

In the display device 100, when the same amount of emitting material solution 166 is dropped into the first to third pixel regions P1 to P3 to form the emitting layer 162 in the first to third pixel regions P1 to P3, the emitting material solution 166 has a different in surface area in each of the first to third pixel regions P1 to P3. Accordingly, evaporation rates of the solvent in the emitting material solution 166 are different in each of the first to third pixel regions P1 to P3, and the evaporated solvent has an influence on adjacent pixel regions. As a result, the property of the drying process of the emitting layer 162 is degraded such that the emitting efficiency is lowered by the non-uniformity of the emitting layer 162.

Figure 5A:
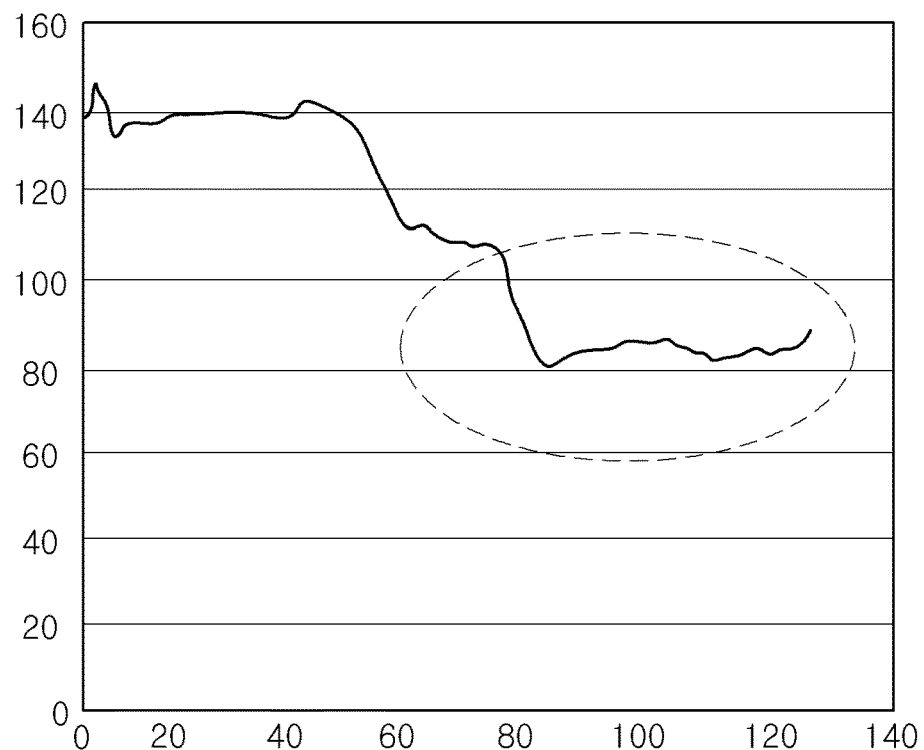
FIGS. 5A and 5B are graphs showing a thickness of an emitting layer in adjacent pixel regions of the display device according to an embodiment of the present invention.
Figure 5B:
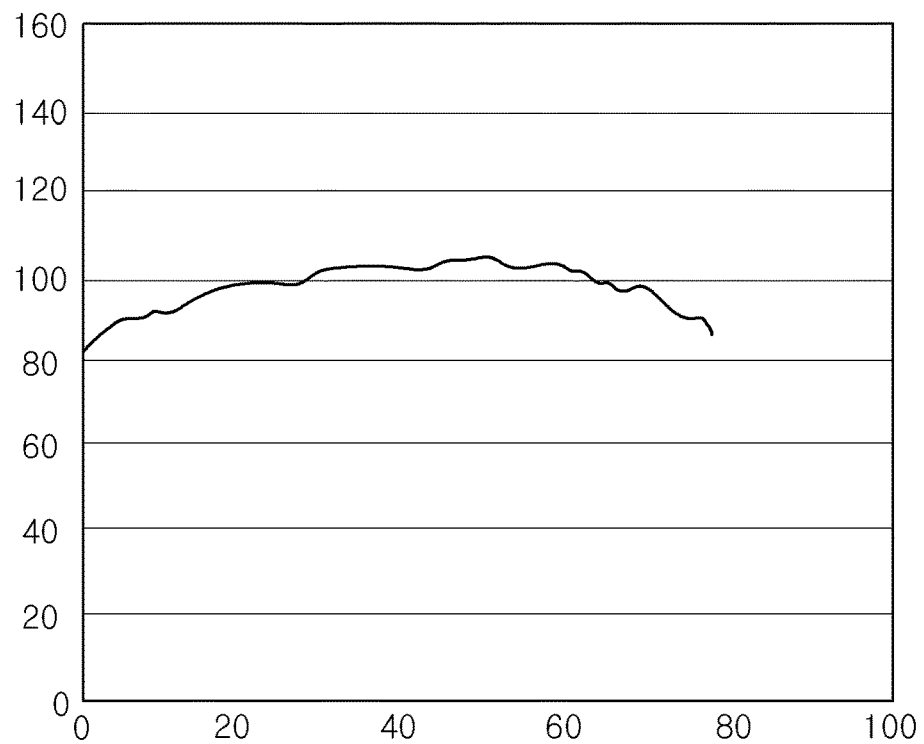

Namely, referring to FIGS. 5A and 5B, which are graphs showing a thickness of an emitting layer in adjacent pixel regions of the display device according to the first embodiment of the present invention, respectively, the emitting layer has a uniform thickness in the pixel region, where a size of the opening in the second bank pattern is relatively small, (FIG. 5B), while the emitting layer has a non-uniform thickness in the pixel region, where a size of the opening in the second bank pattern is relatively large (FIG. 5A). In FIGS. 5A and 5B, a horizontal x axis is a distance (micrometer) from a center to an edge in the pixel region, and a vertical y axis is a thickness (nanometer) of the emitting layer. The thickness of the emitting layer is measured by the "Zygo (3D-profiler)" apparatus.

In other words, a thickness non-uniform property of the emitting layer in adjacent pixel regions is generated by different drying rates (evaporation rates) of the emitting material solution.

Figure 6:
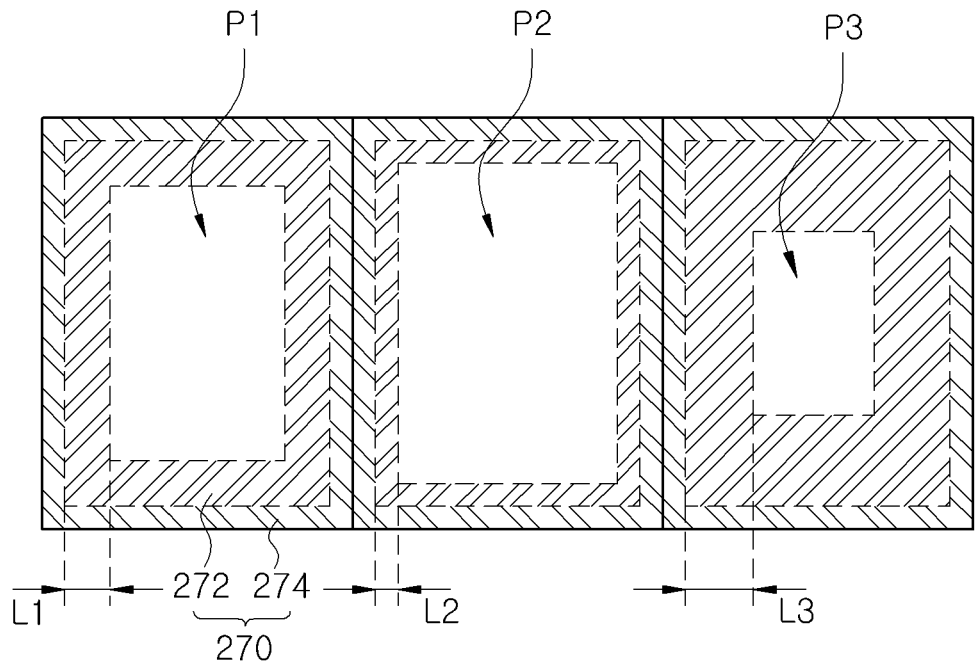
FIG. 6 is a schematic plane view of a unit pixel in a display device according to an embodiment of the present invention.
Figure 7:
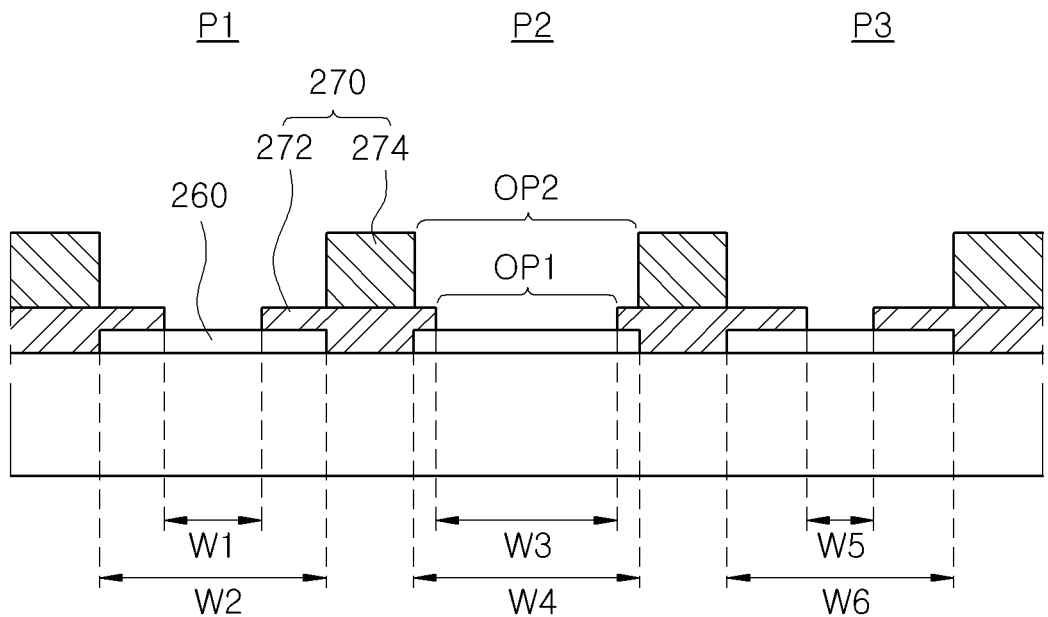
FIG. 7 is a cross-sectional view of a unit pixel in the display device according to an embodiment of the present invention.

FIG. 6 is a schematic plane view of a unit pixel in a display device, which can include three sub-pixels, according to a second embodiment of the present invention, and FIG. 7 is a cross-sectional view of a unit pixel in the display device according to the second embodiment of the present invention.

Referring to FIGS. 6 and 7, in a display device 200 according to the second embodiment of the present invention, first to third pixel regions P1, P2 and P3, which are adjacently arranged, form a unit pixel and have differently sized emitting areas. Namely, the first to third pixel regions P1 to P3 have different emitting area sizes, which are defined as regions surrounded by the first bank pattern 272.

Alternatively, two of the first to third pixel regions P1 to P3 can have same emitting area size. For example, the first and third pixel regions P1 and P3 can have same sized emitting area, while the second pixel region P2 can have the emitting area that is larger than the emitting areas in each of the first and third pixel regions P1 and P3.

The bank 270 has a double-layered structure including a first bank pattern 272 and a second bank pattern 274. The first bank pattern 272 can be formed of a hydrophilic material, and the second bank pattern 274 can be formed of a hydrophobic material.

The first bank pattern 272 covers the edges of the first electrode 260. The second bank pattern 274 is disposed on the first bank pattern 272 and has a width being smaller than the first bank pattern 272. As a result, an edge of the first bank pattern 272 protrudes from the second bank pattern 274.

A first opening OP1 (e.g., the lower opening) formed in the first bank pattern 272 to expose the first electrode 260 has a different sized area, e.g., a plane area, in each of the first to third pixel regions P1 to P3. However, a second opening OP2 (e.g., upper opening) formed in the second bank pattern 274 to expose the first opening OP1 and the edge of the first bank pattern 272 has same sized area (e.g., a plane area) in each of the first to third pixel regions P1 to P3. Namely, the bank 270 includes the first and second openings OP1 and OP2 in each of the first to third pixel regions P1 to P3. The first opening OP1 has a different sized area in each of the first to third pixel regions P1 to P3, but the area sized of the second opening OP2 is the same in each of the first to third pixel regions P1 to P3, in other words the second opening OP2 is equal to each other in the first to third pixel regions P1 to P3.

For example, when the first and third pixel regions P1 and P3 have same emitting area and the second pixel region P2 has an emitting area being greater than each of the first and third pixel regions P1 and P3, the first opening OP1 has a first area in the first and third pixel regions P1 and P3 and a second area, which is different from the first area, in the second pixel region P2. Further, each of the second opening OP2 has the same sized area (e.g., a third area) in the first to third pixel regions P1 to P3.

In the first pixel region P1, two sides of the first bank pattern 272 are spaced apart from each other by a first distance such that the first bank pattern 272 includes a first opening having a first width W1, and two sides of the second bank pattern 274 are spaced apart from each other by a second distance, which is greater than the first distance, such that the second bank pattern 274 includes a second opening having a second width W2 being greater than the first width W1.

In the second pixel region P2, two sides of the first bank pattern 272 are spaced apart from each other by a third distance such that the first bank pattern 272 includes a first opening having a third width W3, and two sides of the second bank pattern 274 are spaced apart from each other by a fourth distance, which is greater than the third distance, such that the second bank pattern 274 includes a second opening having a fourth width W4 being greater than the third width W3.

In the third pixel region P3, two sides of the first bank pattern 272 are spaced apart from each other by a fifth distance such that the first bank pattern 272 includes a first opening having a fifth width W5, and two sides of the second bank pattern 274 are spaced apart from each other by a sixth distance, which is greater than the fifth distance, such that the second bank pattern 274 includes a second opening having a sixth width W6 being greater than the fifth width W5.

The first width W1 is smaller than the third width W3 and greater than the fifth width W5, and the second, fourth and sixth widths W2, W4, W6 are substantially equal (W5<W1<W3, W2=W4=W6).

Namely, an emitting area in the first pixel region P1 is smaller than that in the second pixel region P2 and larger than that in the third pixel region P3, while the first to third pixel regions P1 to P3 have same opening area. In other words, two pixel regions have different sized emitting areas (e.g., lower openings) and but the same sized opening area (e.g., upper openings). As a result, the emitting material solution 166 (of FIG. 4A) has same top surface area in each of the first to third pixel regions P1 to P3. Accordingly, when a drying process is performed to the emitting material solution 166, the solvent in the emitting material solution 166 evaporates or dries at the same rate in each of the first to third pixel regions P1 to P3, thus providing uniform thickness for the emitting layer in each of the first to third pixel regions P1 to P3.

In the display device 200 according to the second embodiment of the present invention, the decrease problem of the display quality in the display device resulting from a difference in the lifetime and the emitting efficiency is prevented, and the non-uniformity problem of the emitting layer 162 (of FIG. 2) resulting from a difference of the evaporating rate in the solution process is overcome.

For example, the third pixel region P3 can be one of a red pixel region and a green pixel region having a longest lifetime, the second pixel region P2 can be a blue pixel region having a shortest lifetime, and the first pixel region P1 can be the other of the red pixel region and the green pixel region.

The second bank pattern 274 is formed on the first bank pattern 272 to form the bank 270. The first bank pattern 272 has a larger area than the second bank pattern 274 such that an edge of the first bank pattern 272 protrudes out from under the second bank pattern 274. The protruding portion of the first bank pattern 272 has a difference in a length in the first to third pixel regions P1 to P3.

Namely, the protruding edge of the first bank pattern 272 from the second bank pattern 274 has a first length L1 in the first pixel region P1, a second length L2, which is smaller than the first length L1, in the second pixel region P2 and a third length L3, which is greater than the first length L1, in the third pixel region P3. When the first bank pattern 272 protrudes from the second bank pattern 274 along a first direction, the "length" is defined as a distance along the first direction between the second bank pattern 274 and an end of the protruding edge, e.g., a side surface facing opposite position of the first bank pattern 272 in the pixel region, of the first bank pattern 272.

Alternatively, when two pixel regions (e.g., the first and third pixel regions P1 and P3) have the same emitting area sizes and one pixel region (e.g., the second pixel region P2) has an emitting area size that is larger than each of the two pixel regions (e.g., the first and third pixel regions P1 and P3), the length of the protruding edge of the first bank pattern 272 from the second bank pattern 274 in the two pixel regions (e.g., the first and third pixel regions P1 and P3) is substantially equal to each other and the length of the protruding edge of the first bank pattern 272 from the second bank pattern 274 in the one pixel regions (e.g., the second pixel region P2) can be smaller than the length of the protruding edge of the first bank pattern 272 from the second bank pattern 274 in the two pixel regions (e.g., the first and third pixel regions P1 and P3).

Accordingly, the emitting layer 162 (of FIG. 2) and the first bank pattern 272 contact (or overlap) each other by a first area in the first pixel region P1, by a second area, which is smaller than the first area, in the second pixel region P2 and by a third area, which is greater than the first area, in the third pixel region P3.

Since the emitting area in the first pixel region P1 is smaller than the emitting area in the second pixel region P2 and larger than the emitting area in the third pixel region P3, a contact area between the emitting layer 162 and the first electrode 260 in the first pixel region P1 is smaller than that in the second pixel region P2 and greater than that in the third pixel region P3. A contact area between the emitting layer 162 and the first bank pattern 272 (or the bank 270) in the first pixel region P1 is greater than that in the second pixel region P2 and smaller than that in the third pixel region P3.

Alternatively, when two pixel regions (e.g., the first and third pixel regions P1 and P3) have the same sized emitting area and one pixel region (e.g., the second pixel region P2) has an emitting area size that is larger than each of the two pixel regions (e.g., the first and third pixel regions P1 and P3), the contact area between the emitting layer and the first electrode in the two pixel regions (e.g., the first and third pixel regions P1 and P3) is substantially equal to each other and the contact area between the emitting layer and the first electrode in the one pixel regions (e.g., the second pixel region P2) can be greater than the contact area between the emitting layer and the first electrode in the two pixel regions (e.g., the first and third pixel regions P1 and P3). In addition, the contact area between the emitting layer and the first bank pattern in the two pixel regions (e.g., the first and third pixel regions P1 and P3) is substantially equal to each other and the contact area between the emitting layer and the first bank pattern in the one pixel regions (e.g., the second pixel region P2) can be smaller than the contact area between the emitting layer and the first bank pattern in the two pixel regions (e.g., the first and third pixel regions P1 and P3).

As mentioned above, in the display device 200 according to the second embodiment of the present invention, since a size of the first opening OP1 in the first bank pattern 272 is different in the first to third pixel regions P1 to P3, there are advantages in the lifetime and the display quality. In addition, since a size of the second opening OP2 in the second bank pattern 274 is substantially same in the first to third pixel regions P1 to P3, the property uniformity of the emitting layer is improved (e.g., the emitting layer in each of the first to third pixel regions P1 to P3 can have the same thickness).

Figure 8A:
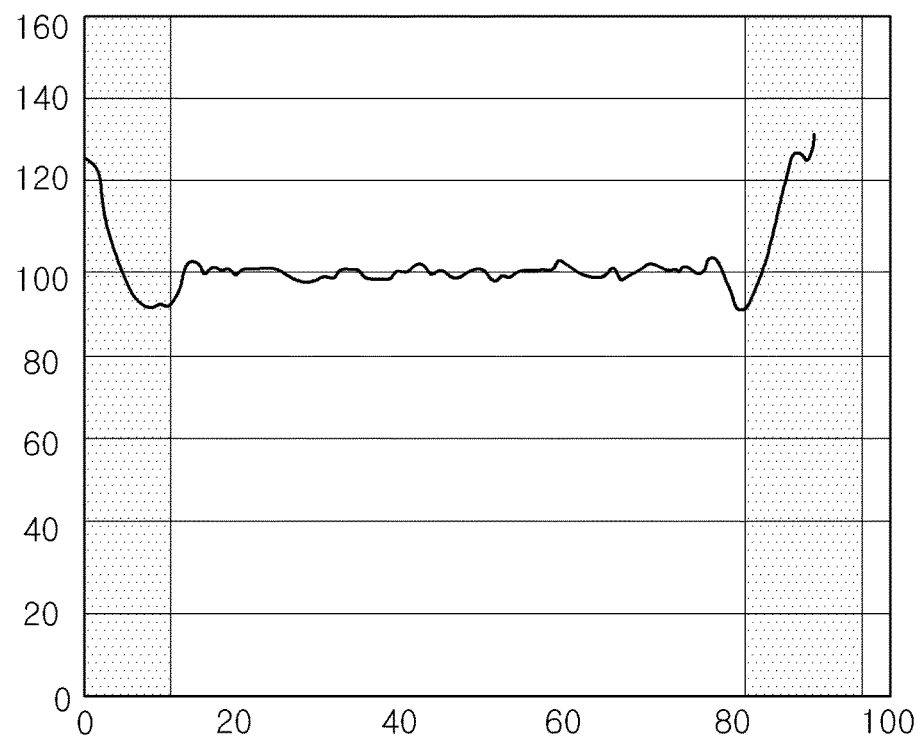
FIGS. 8A and 8B are graphs showing a thickness of an emitting layer in adjacent pixel regions of the display device according to an embodiment of the present invention, respectively.
Figure 8B:
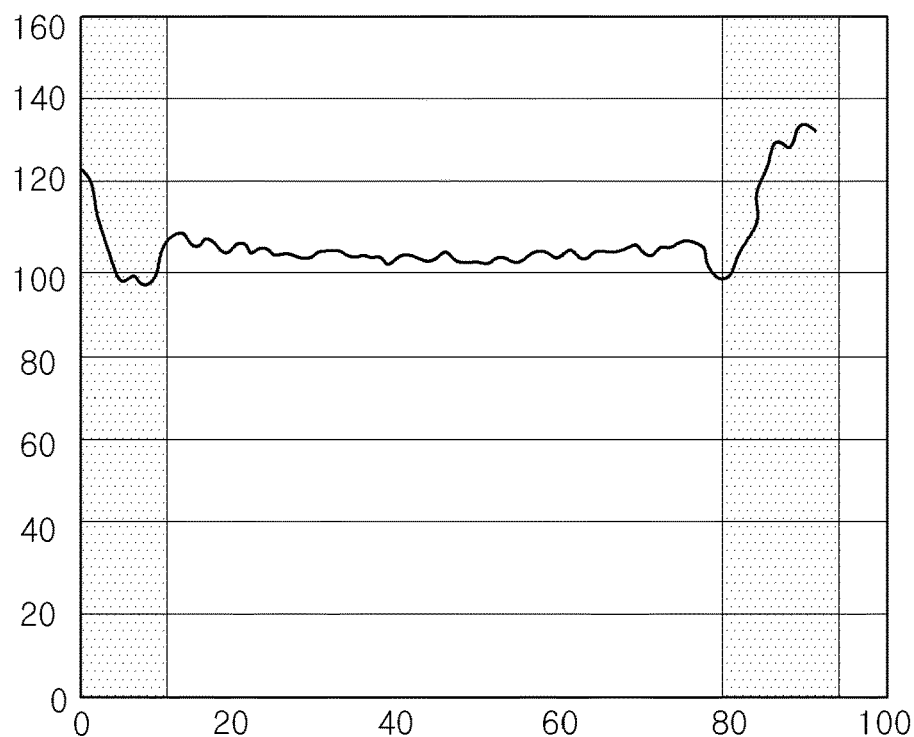

Referring to FIGS. 8A and 8B, which are graphs showing a thickness of an emitting layer in adjacent pixel regions of the display device according to the second embodiment of the present invention, respectively, although an area of the first opening in the first bank pattern is different in the pixel regions, the emitting layer in the pixel regions has a uniform thickness with the second opening having the same area. In FIGS. 8A and 8B, a horizontal x axis is a distance (e.g., micrometer) from a center to an edge in the pixel region, and a vertical y axis is a thickness (e.g., nanometer) of the emitting layer. The thickness of the emitting layer is measured by the "Zygo (3D-profiler)" apparatus.

Figure 9:
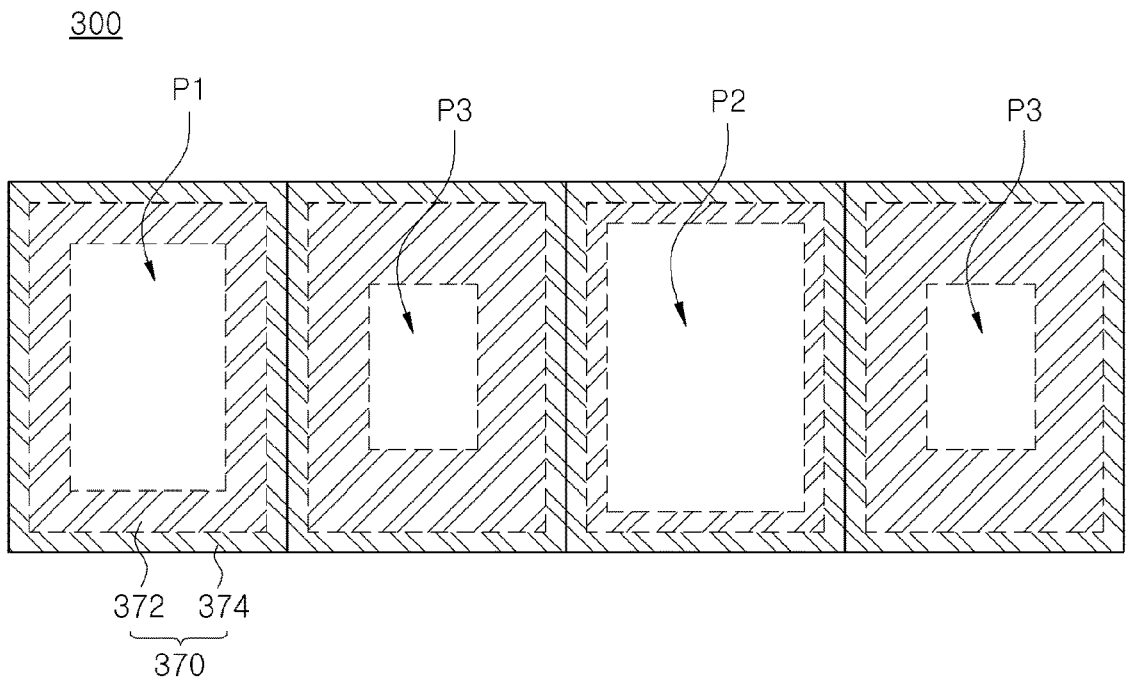
FIG. 9 is a schematic plane view of a unit pixel in a display device according to an embodiment of the present invention.

FIG. 9 is a schematic plane view of a unit pixel in a display device according to a third embodiment of the present invention.

As shown in FIG. 9, in a display device 300 according to the third embodiment of the present invention, one first pixel region P1, one second pixel region P2 and two third pixel regions P3 form a unit pixel, and the first to third pixel regions P1 to P3 have different sized emitting areas. One of the third pixel regions P3 is positioned between the first and second pixel regions P1 and P2, and one of the first and second pixel regions P1 and P2 is positioned between two third pixel regions P3.

The bank 370 surrounding the first to third pixel regions P1 to P3 has a double-layered structure including a first bank pattern 372 and a second bank pattern 374. The first bank pattern 372 can be formed of a hydrophilic material, and the second bank pattern 374 can be formed of a hydrophobic material.

The first bank pattern 372 covers the edges of the first electrode. The second bank pattern 374 is disposed on the first bank pattern 372 and has a width that is smaller than the first bank pattern 372. As a result, an edge of the first bank pattern 372 protrudes out from under the second bank pattern 374.

The first bank pattern 372 has different area size in each of the first to third pixel regions P1 to P3, and the second bank pattern 374 has same area size in each of the first to third pixel regions P1 to P3.

Namely, in the first pixel region P1, two sides of the first bank pattern 372 are spaced apart from each other by a first distance such that the first bank pattern 372 includes a first opening having a first width, and two sides of the second bank pattern 374 are spaced apart from each other by a second distance, which is greater than the first distance, such that the second bank pattern 374 includes a second opening having a second width being greater than the first width.

In the second pixel region P2, two sides of the first bank pattern 372 are spaced apart from each other by a third distance such that the first bank pattern 372 includes a first opening having a third width, and two sides of the second bank pattern 374 are spaced apart from each other by a fourth distance, which is greater than the third distance, such that the second bank pattern 374 includes a second opening having a fourth width being greater than the third width.

In the third pixel region P3, two sides of the first bank pattern 372 are spaced apart from each other by a fifth distance such that the first bank pattern 372 includes a first opening having a fifth width, and two sides of the second bank pattern 374 are spaced apart from each other by a sixth distance, which is greater than the fifth distance, such that the second bank pattern 374 includes a second opening having a sixth width being greater than the fifth width.

The first width is smaller than the third width and greater than the fifth width, and the second, fourth and sixth widths are substantially same (e.g., W5<W1<W3 and W2=W4=W6).

Namely, an emitting area in the first pixel region P1 is smaller than that in the second pixel region P2 and larger than that in the third pixel region P3, while the emitting material solution 166 (of FIG. 4A) in the solution process has same surface area in the first to third pixel regions P1 to P3.

In the present invention, since an emitting area has different sizes in each of the first to third pixel regions P1 to P3 according to a property of the emitting material for the first to third pixel regions P1 to P3, the lifetime and the display quality of the display device 300 is improved. In addition, since a surface area of the emitting material solution is same in each of the first to third pixel regions P1 to P3, the property uniformity of the emitting layer is improved (e.g., all have the same thickness).

Moreover, since there are two third pixel regions P3 for the emitting material, e.g., blue emitting material, which has low lifetime and emitting efficiency, the driving voltage for the third pixel region P3 is lowered. Accordingly, problems in the lifetime and the display quality of the display device 300 resulting from the thermal degradation of the third pixel region P3, e.g., the blue pixel region, are prevented or minimized.

Figure 10:
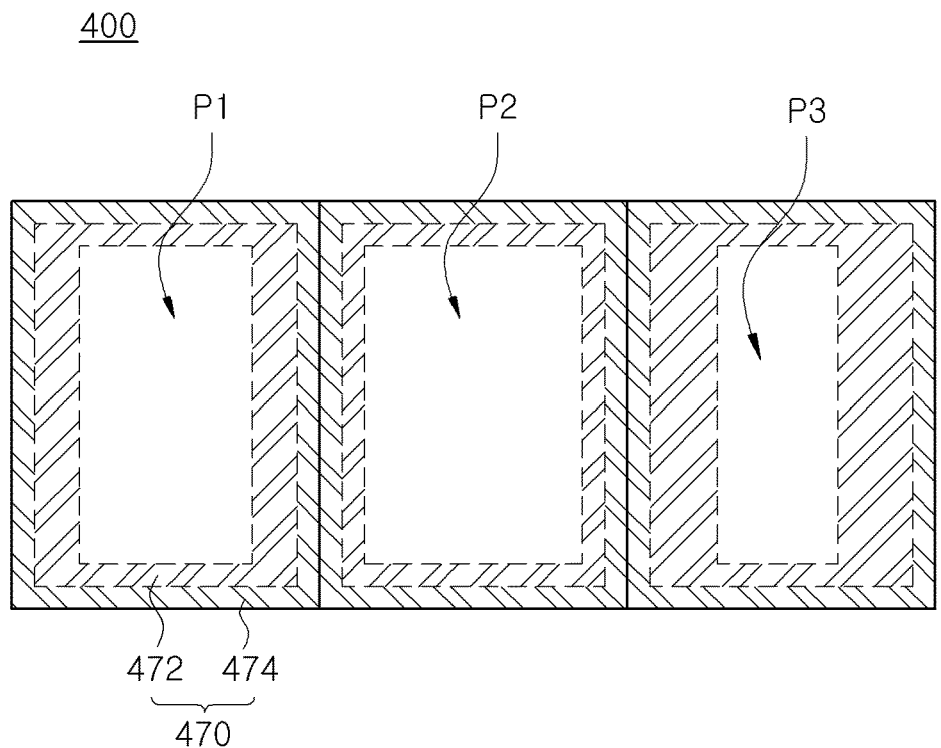
FIG. 10 is a schematic plane view of a unit pixel in a display device according to an embodiment of the present invention.

FIG. 10 is a schematic plane view of a unit pixel in a display device according to a fourth embodiment of the present invention.

As shown in FIG. 10, in a display device 400 according to the fourth embodiment of the present invention, first to third pixel regions P1, P2 and P3 forming a unit pixel have different sized emitting areas. Namely, in the first to third pixel regions P1 to P3, the bank 470 has a difference in area size.

Alternatively, two of the first to third pixel regions P1 to P3 can have same sized emitting area. For example, the first and third pixel regions P1 and P3 can have same sized emitting area, while the second pixel region P2 can have larger emitting area size than each of the first and third pixel regions P1 and P3.

The bank 470 surrounding the first to third pixel regions P1 to P3 has a double-layered structure including a first bank pattern 472 and a second bank pattern 474. The first bank pattern 472 can be formed of a hydrophilic material, and the second bank pattern 474 can be formed of a hydrophobic material.

The first bank pattern 472 covers the edges of the first electrode. The second bank pattern 474 is disposed on the first bank pattern 472 and has a smaller width than the first bank pattern 472. As a result, an edge of the first bank pattern 472 protrudes from under the second bank pattern 474.

The first bank pattern 472 has different sized area in each of the first to third pixel regions P1 to P3, while the second bank pattern 474 has the same sized area in each of the first to third pixel regions P1 to P3.

In other words, in the display device 400 of the present invention, two pixel regions have different sized emitting areas but the same sized opening areas.

Accordingly, since an emitting area has a size difference in each of the first to third pixel regions P1 to P3 according to a property of the emitting material for the first to third pixel regions P1 to P3, the lifetime and the display quality of the display device 400 is improved. In addition, since a surface area of the emitting material solution is same in the first to third pixel regions P1 to P3, the property uniformity of the emitting layer is improved.

The first bank pattern 472 has different width along a first direction in the first to third pixel regions P1 to P3 and the same width along a second direction in each of the first to third pixel regions P1 to P3.

Namely, in the vertical direction, two sides of the first bank pattern 472 are spaced apart from each other by the same distance in the first to third pixel regions P1 to P3. However, in the horizontal direction, two sides of the first bank pattern 472 are spaced apart from each other by different distances in each of the first to third pixel regions P1 to P3.

In the display device 200 of FIG. 6, the first bank pattern 272 in the first pixel region P1 has a greater width than that in the second pixel region P2 along both the vertical direction and the horizontal direction. However, in the display device 400 of FIG. 10, the first bank pattern 472 in the first pixel region P1 has a greater width than that in the second pixel region P2 along only the horizontal direction. Further, the second bank pattern 474 has the same width (e.g., a length) in each of the first to third pixel regions P1 to P3 along both the vertical direction and the horizontal direction.

Accordingly, the first opening in the first bank pattern 472 has the same width along the vertical direction, e.g., the second direction, in each of the first to third pixel regions P1 to P3 and different width along the horizontal direction, e.g., the first direction, in each of the first to third pixel regions P1 to P3. The second opening in the second bank pattern 474 has same width along the vertical and horizontal directions in each of the first to third pixel regions P1 to P3.

As a result, in the horizontal direction, a contact area between the emitting layer 162 (of FIG. 2) and the first electrode 160 (of FIG. 2) and a contact area between the emitting layer 162 and the first bank pattern 472 is different in each of the first to third pixel regions P1 to P3. In the vertical direction, the contact area between the emitting layer 162 and the first electrode 160 and the contact area between the emitting layer 162 and the first bank pattern 472 is substantially same in each of the first to third pixel regions P1 to P3.

In the display device of the present invention, the plurality of pixel regions can each have different sized emitting areas but opening areas of the same size such that the lifetime and the display quality of the display device and the property uniformity of the emitting layer are improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
a substrate including first and second pixel regions;
a first electrode in each of the first and second pixel regions; and
a bank disposed at a boundary of each of the first and second pixel regions and including a first bank pattern on the first electrode and a second bank pattern on the first bank pattern,
wherein the first bank pattern defines a first opening in each of the first and second pixel regions exposing a portion of the first electrode, and the second bank pattern defines a second opening in each of the first and second pixel regions,
wherein the second opening defines a formation area of an emitting layer and is larger than the first opening, and
wherein a width of the first opening in the first pixel region along a first direction is smaller than a width of the first opening in the second pixel region along the first direction, and a width of the first opening in the first pixel region along a second direction, which is perpendicular to the first direction, is smaller than a width of the first opening in the second pixel region along the second direction, while a width of the second opening in the first pixel region along the first direction is equal to a width of the second opening in the second pixel region along the first direction, and a width of the second opening in the first pixel region along the second direction is equal to a width of the second opening in the second pixel region along the second direction, and
wherein a center of the first opening overlaps with a center of the second opening in each of the first and second pixel regions.

2. The display device according to claim 1, wherein the substrate further includes a third pixel region and the bank is disposed at a boundary of the third pixel region and defines the first opening exposing a portion of the first electrode in the third pixel region and the second opening defining the formation area of the emitting layer in the third pixel region, and
wherein an area of the first opening in the first pixel region is larger than an area of the first opening in the third pixel region, and an area of the second opening in the first pixel region and an area of the second opening in the second pixel region are same as an area of the second opening in the third pixel region.

3. The display device according to claim 2, wherein an upper surface area and a shape of a top surface of the emitting layer are the same in each of the first, second and third pixels regions,
wherein a thickness of the emitting layer in a vertical direction is the same in each of the first, second and third pixel regions, and
wherein at least two pixel regions among the first, second and third pixel regions have different sized lower surface areas for the emitting layer in the at least two pixel regions.

4. The display device according to claim 1, wherein the substrate further includes a third pixel region and the bank is disposed at a boundary of the third pixel region and defines the first opening exposing a portion of the first electrode in the third pixel region and the second opening defining the formation area of the emitting layer in the third pixel region, and
wherein an area of the first opening in the first pixel region is same as an area of the first opening in the third pixel region, and an area of the second opening in the first pixel region and an area of the second opening in the second pixel region are same as an area of the second opening in the third pixel region.

5. The display device according to claim 1, wherein the first pixel region is one of a red pixel region and a green pixel region, and the second pixel region is a blue pixel region, and the third pixel region is the other of the red pixel region and the green pixel region.

6. The display device according to claim 1, wherein one first pixel region, one second pixel region and two third pixel regions from a unit pixel, and
wherein one of the two third pixel regions is positioned between the first and second pixel regions, and one of the first and second pixel regions is positioned between the two third pixel regions.

7. The display device according to claim 6, wherein the third pixel region is a blue pixel region.

8. A display device, comprising:
a substrate including first and second pixel regions;
a first electrode in each of the first and second pixel regions; and
a bank disposed at a boundary of the first and second pixel regions and including a first bank pattern disposed on the first electrode and a second bank pattern disposed on the first bank pattern,
wherein the first bank pattern in the first pixel region protrudes from under the second bank pattern by a first length along a first direction, and the first bank pattern in the second pixel region protrudes from under the second bank pattern by a second length along the first direction, wherein the second length is smaller than the first length,
wherein a length of the first bank pattern in the first pixel region protruding from under the second bank pattern along a second direction, which is perpendicular to the first direction, is greater than a length of the first bank pattern in the second pixel region protruding from under the second bank pattern along the second direction, wherein in the bank between the first and second pixel regions, the first bank pattern protrudes from under the second bank pattern by the first length toward the first pixel region and by the second length toward the second pixel region, and wherein a width of an upper opening in the bank in the first pixel region is equal to a width of an upper opening in the bank in the second pixel region while a light emitting area of the second pixel region is larger than a light emitting area of the first pixel region, and a center of the upper opening in the first pixel region overlaps with a center of the first electrode in the first pixel region and a center of the upper opening in the second pixel region overlaps with a center of the first electrode in the second pixel region.

9. The display device according to claim 8, wherein the substrate further includes a third pixel region and the bank is disposed at a boundary of the third pixel region, and wherein the first bank pattern in the third pixel region protrudes from under the second bank pattern by a third length along the first direction, wherein the third length is longer than the first length.

10. The display device according to claim 8, wherein the substrate further includes a third pixel region and the bank is disposed at a boundary of the third pixel region, and wherein the first bank pattern in the third pixel region protrudes from under the second bank pattern by a third length along the first direction, wherein the third length is equal to the first length.

11. The display device according to claim 8, wherein an exposed area of a portion of the first electrode exposed by the first bank pattern in the first pixel region is smaller than an exposed area of a portion of the first electrode exposed by the first bank pattern in the second pixel region.

12. The display device according to claim 8, wherein the substrate further includes a third pixel region and the bank is disposed at a boundary of the third pixel region, and wherein an exposed first bank portion of the first bank pattern in the third pixel region is exposed by the second bank pattern and an exposed first bank portion of the first bank pattern in the second pixel region is exposed by the second bank pattern, and wherein an area of the exposed first bank portion in the second pixel region is smaller than an area of the exposed first bank portion in the third pixel region.

* * * * *